US012627286B2

(12) United States Patent
Li

(10) Patent No.: US 12,627,286 B2
(45) Date of Patent: May 12, 2026

(54) DIGITAL DUTY CYCLE CORRECTOR CIRCUIT

(71) Applicant: Taiwan Semiconductor Manufacturing Company, Ltd., Hsinchu (TW)

(72) Inventor: Chang-Yi Li, Yunlin County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 18/756,990

(22) Filed: Jun. 27, 2024

(65) Prior Publication Data

US 2026/0005680 A1 Jan. 1, 2026

(51) Int. Cl.
*H03K 5/156* (2006.01)
*H03K 3/017* (2006.01)
*H03K 5/135* (2006.01)

(52) U.S. Cl.
CPC ........... *H03K 5/1565* (2013.01); *H03K 3/017* (2013.01); *H03K 5/135* (2013.01)

(58) Field of Classification Search
CPC ....... H03K 5/1565; H03K 3/017; H03K 5/135
USPC ........................................ 327/175
See application file for complete search history.

(56) References Cited

U.S. PATENT DOCUMENTS

| | | | | | |
|---|---|---|---|---|---|
| 5,907,254 | A | * | 5/1999 | Chang | H03K 5/086 |
| | | | | | 327/175 |
| 6,781,419 | B2 | * | 8/2004 | Harrison | H03K 5/1565 |
| | | | | | 326/98 |

| | | | | | |
|---|---|---|---|---|---|
| 6,809,570 | B2 | * | 10/2004 | Francom | G06F 1/10 |
| | | | | | 327/365 |
| 6,853,225 | B2 | * | 2/2005 | Lee | H03K 5/151 |
| | | | | | 327/158 |
| 7,298,193 | B2 | * | 11/2007 | Agarwal | H03K 5/1565 |
| | | | | | 327/175 |
| 7,307,461 | B2 | * | 12/2007 | Nguyen | G11C 7/1078 |
| | | | | | 327/171 |
| 7,463,075 | B2 | * | 12/2008 | White | H03K 5/133 |
| | | | | | 327/175 |
| 7,535,270 | B2 | * | 5/2009 | Lee | G11C 7/1072 |
| | | | | | 327/158 |
| 7,642,830 | B2 | * | 1/2010 | White | H03L 7/0816 |
| | | | | | 327/175 |
| 7,705,647 | B2 | * | 4/2010 | Dai | H03K 5/1565 |
| | | | | | 327/170 |
| 8,106,696 | B2 | * | 1/2012 | Kikuchi | H03K 5/1565 |
| | | | | | 327/175 |
| 8,149,037 | B2 | * | 4/2012 | Lee | H03K 5/1565 |
| | | | | | 327/175 |
| 10,547,298 | B1 | * | 1/2020 | Mekky | H03K 7/08 |

(Continued)

*Primary Examiner* — Ryan Jager
(74) *Attorney, Agent, or Firm* — Merchant & Gould P.C.

(57) ABSTRACT

A digital duty cycle corrector circuit is provided. The duty cycle corrector circuit includes a control circuit having a first transistor and a second transistor connected at a first node and configured to adjust a duty cycle of an input clock received at the first node and provide a duty adjusted output clock at a second node. A single to differential circuit is connected to the control circuit at the second node. The single to differential circuit generates a first output clock and a second output clock from the duty adjusted output clock. A feedback circuit configured to provide the duty adjusting output clock to a gate of each of the first transistor and the second transistor.

20 Claims, 6 Drawing Sheets

(56) References Cited

U.S. PATENT DOCUMENTS

| | | | | |
|---|---|---|---|---|
| 11,177,984 B1 * | 11/2021 | Zheng | ................... | H04L 27/01 |
| 11,671,086 B2 * | 6/2023 | Kimura | ................... | H03K 5/13 |
| | | | | 327/175 |
| 2001/0017560 A1 * | 8/2001 | Kato | ................... | C08G 77/442 |
| | | | | 327/175 |
| 2002/0070752 A1 * | 6/2002 | Harrison | ................... | G06F 1/08 |
| | | | | 326/29 |
| 2002/0075039 A1 * | 6/2002 | Harrison | ................... | G06F 1/08 |
| | | | | 326/95 |
| 2006/0284659 A1 * | 12/2006 | Tambouris | .......... | H03K 5/1565 |
| | | | | 327/175 |
| 2007/0296477 A1 * | 12/2007 | White | ................... | H03K 5/133 |
| | | | | 327/175 |
| 2008/0164922 A1 * | 7/2008 | Yun | ................... | H03L 7/0816 |
| | | | | 327/175 |
| 2008/0204097 A1 * | 8/2008 | Wu | ................. | H03K 3/356104 |
| | | | | 327/175 |
| 2009/0251184 A1 * | 10/2009 | Park | ................... | H03K 5/1565 |
| | | | | 327/175 |
| 2010/0225372 A1 * | 9/2010 | Satoh | ................... | H03L 7/0816 |
| | | | | 327/175 |
| 2011/0187907 A1 * | 8/2011 | Takahashi | ............... | H10F 39/12 |
| | | | | 341/169 |
| 2014/0266360 A1 | 9/2014 | Ma | | |
| 2014/0266361 A1 * | 9/2014 | Shashidharan | ...... | H03K 5/1565 |
| | | | | 327/175 |
| 2015/0358001 A1 * | 12/2015 | Sridhar | ............... | H03K 5/1565 |
| | | | | 327/175 |
| 2016/0164508 A1 * | 6/2016 | Ma | ................ | H03K 5/1565 |
| | | | | 327/170 |
| 2016/0164509 A1 * | 6/2016 | Ma | ........................ | H03K 5/12 |
| | | | | 327/170 |
| 2017/0264277 A1 * | 9/2017 | Ma | ........................ | H03K 5/05 |
| 2019/0044521 A1 * | 2/2019 | Forey | ..................... | H03G 3/20 |
| 2023/0079802 A1 * | 3/2023 | Nakata | ............... | G11C 7/1066 |
| | | | | 327/175 |

* cited by examiner

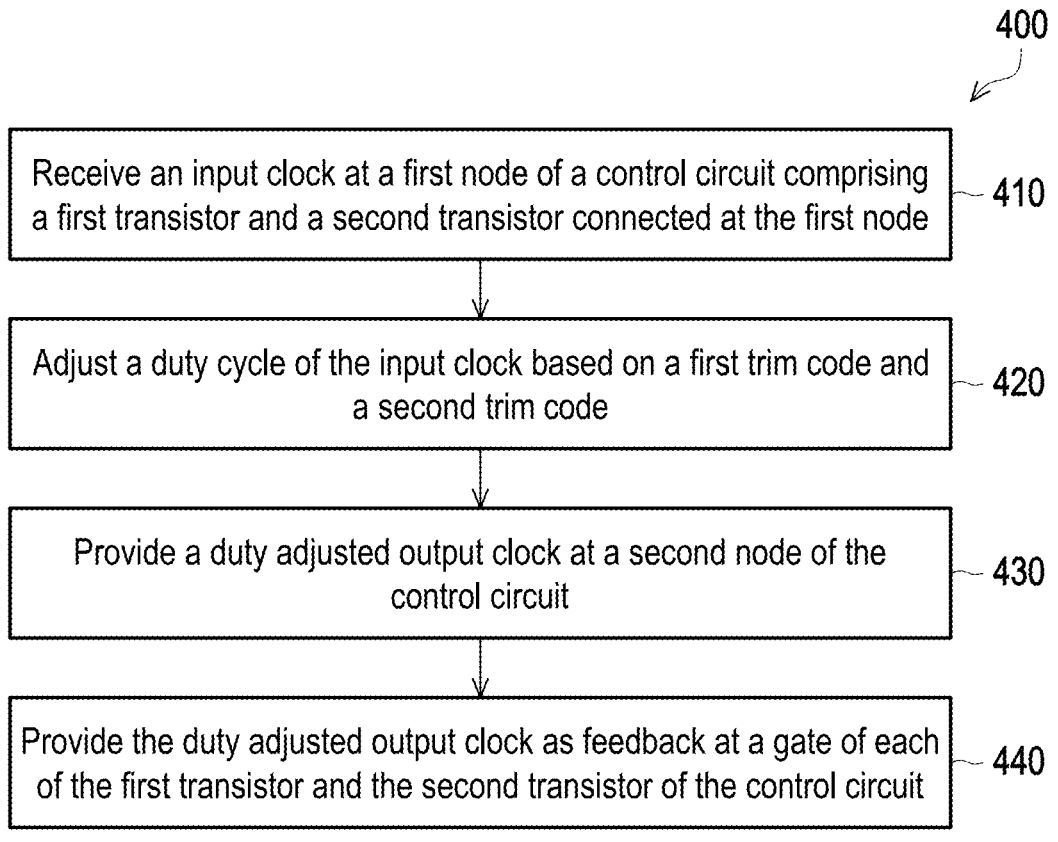

400

Receive an input clock at a first node of a control circuit comprising a first transistor and a second transistor connected at the first node ~ 410

Adjust a duty cycle of the input clock based on a first trim code and a second trim code ~ 420

Provide a duty adjusted output clock at a second node of the control circuit ~ 430

Provide the duty adjusted output clock as feedback at a gate of each of the first transistor and the second transistor of the control circuit ~ 440

FIG. 7

DIGITAL DUTY CYCLE CORRECTOR CIRCUIT

BACKGROUND

The number of high-speed circuits and high-speed systems continues to increase. Generally, the duty cycle of a clock signal in a high-speed circuit should be at fifty percent. However, due to variations in process, voltage, and temperature (PVT), the duty cycle of the clock signal is usually above or below fifty percent. In some instances, the duty cycle may deviate greatly from fifty percent, even when the duty cycle of the clock source is at fifty percent. Additionally, determining and applying corrections to a duty-cycle error can be challenging.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion. In addition, the drawings are illustrative as examples of embodiments of the invention and are not intended to be limiting.

FIG. 7 is a flow diagram of a method for adjusting a duty cycle of an input clock in accordance with some embodiments.

DETAILED DESCRIPTION

Figure 1:
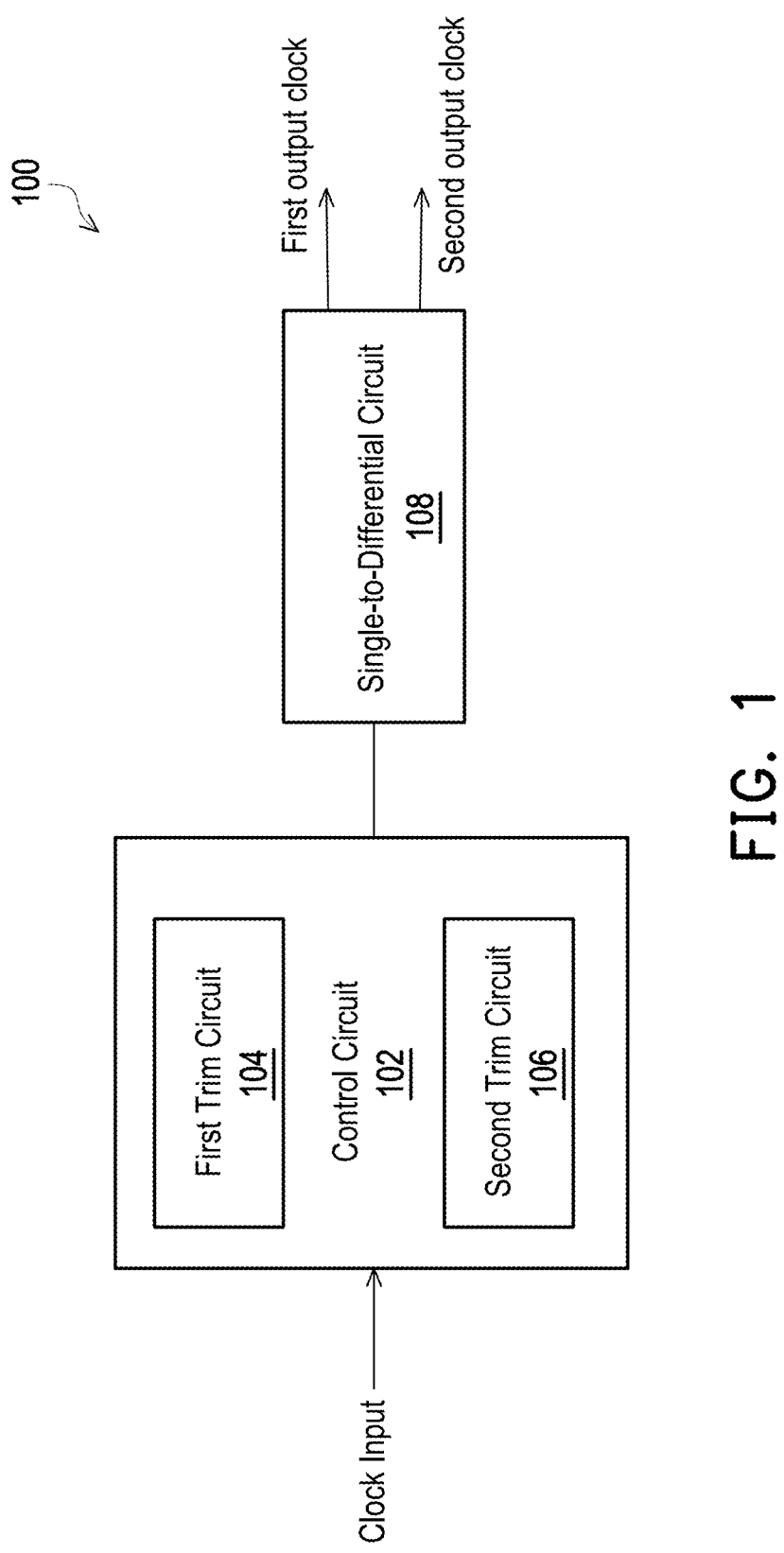
FIG. 1 is a block diagram of a first example of a digital Duty Cycle Corrector (DCC) circuit in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A traditional analog duty-cycle corrector circuit uses an analog integrator to detect the duty cycle error. However, the analog integrator can only be used in low-speed applications. As compared to an analog duty-cycle corrector, a digital duty cycle corrector does not use the voltage control method, and thus it is less influenced by the leakage current of transistors. In addition, a digital duty cycle corrector operates in a lower voltage range. However, a digital duty cycle corrector suffers from inferior duty cycle linearity.

Embodiments disclosed herein provide a digital Duty Cycle Corrector (DCC) circuit that produces a fifty percent (50%) duty cycle for a clock signal. Embodiments of a digital DCC circuit can be used in both low-speed and high-speed circuits and systems, including, for example, processing devices, memory input/output interfaces, and high-frequency data converters. Example processing devices include, but are not limited to, a central processing unit, a microprocessor, and a digital signal processor. In a non-limiting nonexclusive example, a digital DCC circuit can be implemented in, but are not limited to, a deskew circuit, a memory input/output interface, and/or a data converter circuit.

The disclosed digital DCC circuit may operate on a broad frequency range of input signals and/or may accommodate a wide range of duty-cycle error. Additionally or alternatively, embodiments of the DCC circuit are less complex than conventional DCC circuits and use less area on a die. For example, the example embodiments of the DCC circuits are constructed with fewer transistors than convention DCC circuits. In some instances, the DCC circuits consume less power than the conventional duty-cycle corrector circuits.

FIG. 1 is a block diagram of a digital DCC circuit 100 in accordance with some embodiments. As shown in FIG. 1, digital DCC circuit 100 includes a control circuit 102. Control circuit 102 includes a first trim circuit 104 and a second trim circuit 106. Digital DCC circuit 100 further includes a single to differential circuit 108 connected to control circuit 102. Control circuit 102 receives an input clock and adjusts the duty cycle of the input clock to be substantially equal to 50% in conjugation with first trim circuit 104 and second trim circuit 106. The duty adjusted output clock is provided to and is received by single to differential circuit 108. Single to differential circuit 108 generates a first output clock and a second output clock from the duty adjusted output clock. The first output clock and the second output clock have a phase difference of 180 degrees.

Figure 2:
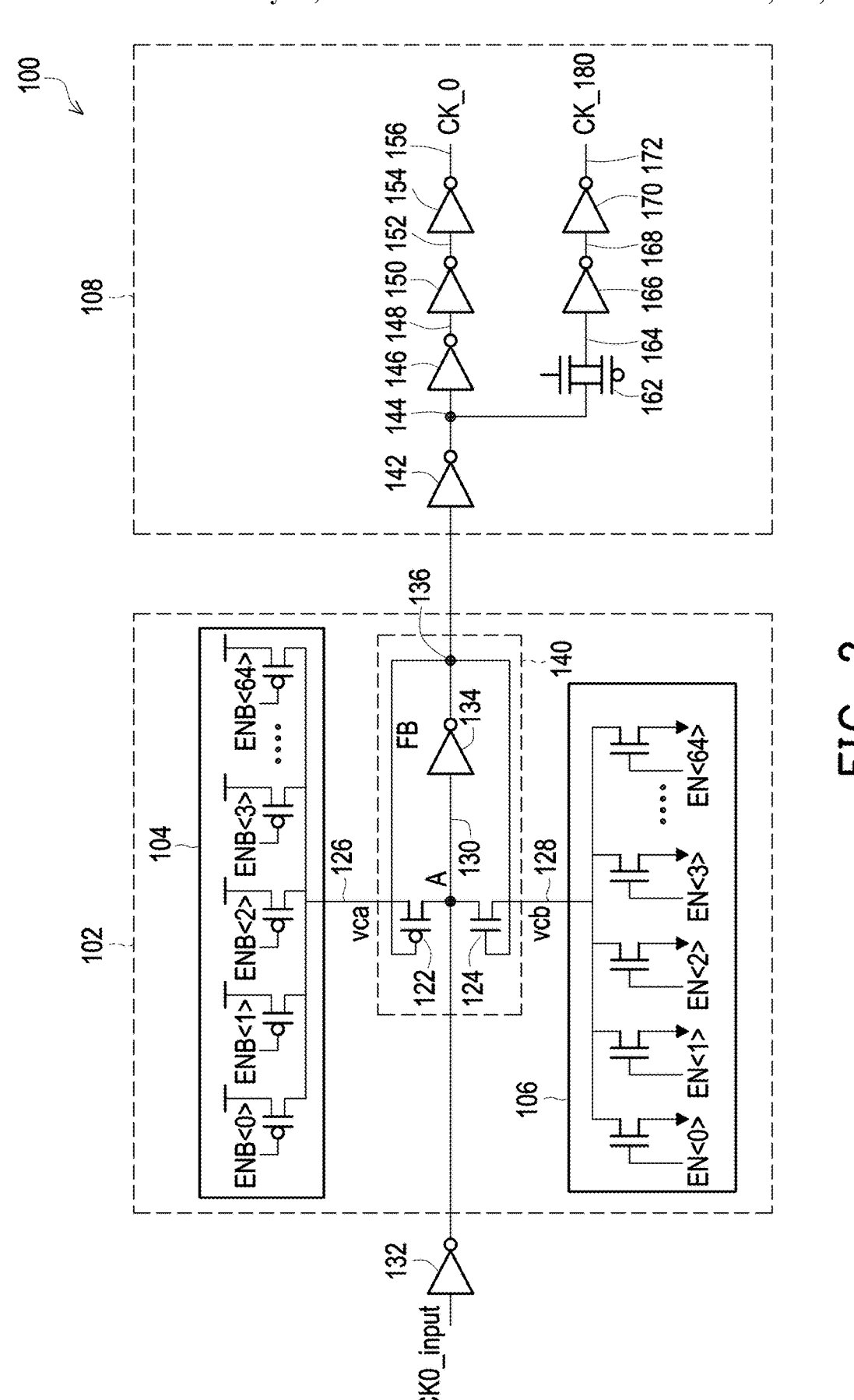
FIG. 2 is an example circuit diagram of the digital DCC circuit of FIG. 1 in accordance with some embodiments.

FIG. 2 is an example circuit diagram of the digital DCC circuit 100 of FIG. 1 in accordance with some embodiments. As shown in FIG. 2, DCC circuit 100 includes control circuit 102 and single to differential circuit 108 connected to control circuit 102. Control circuit 102 includes first trim circuit 104 and second trim circuit 106. In addition, control circuit 102 includes first transistor 122 and a second transistor 124. A source/drain of first transistor 122 is connected to first trim circuit 104 at node 126. First trim circuit 104 provides a first voltage at the source/drain of first transistor 122. The first voltage is variable and varies with a trim code. A source/ drain of second transistor 124 is connected to second trim circuit 106 at node 128. Second trim circuit 106 provides a second voltage at the source/drain of second transistor 124. The second voltage is variable and varies with a trim code as well. As discussed in the following sections of the disclosure, the trim codes are determined based on the duty cycle of the input clock. A drain/source of first transistor 122 is connected to a drain/source of second transistor 124 at a node 130. As used herein, drain/source may refer to a drain or a source, individually or collectively, dependent upon the context. Node 130 is also referred to as an input node or a first node.

An input clock (shown as CKO_iput) is received at a first terminal of invertor 132. Invertor 132 inverts the input clock and provides inverted input clock at a second terminal. The second terminal of invertor 132 is connected to node 130. A first terminal of invertor 134 is connected to node 130. A second terminal of invertor 134 is connected to node 136. A feedback circuit 140 connects node 136 to a gate of each of first transistor 122 and second transistor 124. Node 136 is also referred to as an output node for control circuit 102 or a second node. As discussed in greater detail in the following sections of the disclosure, control circuit 102 adjusts duty cycle of the input clock and provides duty adjusted output clock at node 136. Therefore, in some examples, control circuit 102 is also referred to as a Duty Cycle Adjuster (DCA) circuit.

First trim circuit 104 includes a first plurality of transistors connected in parallel to each other between a supply voltage node and node 126. In some examples, each of the first plurality of transistors is a p-Channel Metal Oxide Semiconductor (PMOS) transistors. However, other types of transistors may be used to form first trim circuit 104. In addition, although, first trim circuit 104 is shown to include 64 first transistors, it can include a different number of first transistors.

Second trim circuit 106 includes a second plurality of transistors connected in parallel to each other between node 128 and ground. In some examples, each of the second plurality of transistors is a n-Channel Metal Oxide Semiconductor (NMOS) transistor. However, other types of transistors may be used to form second trim circuit 106. Although, second trim circuit 106 is shown to include 64 second transistors, it can include a different number of second transistors.

Figure 3:
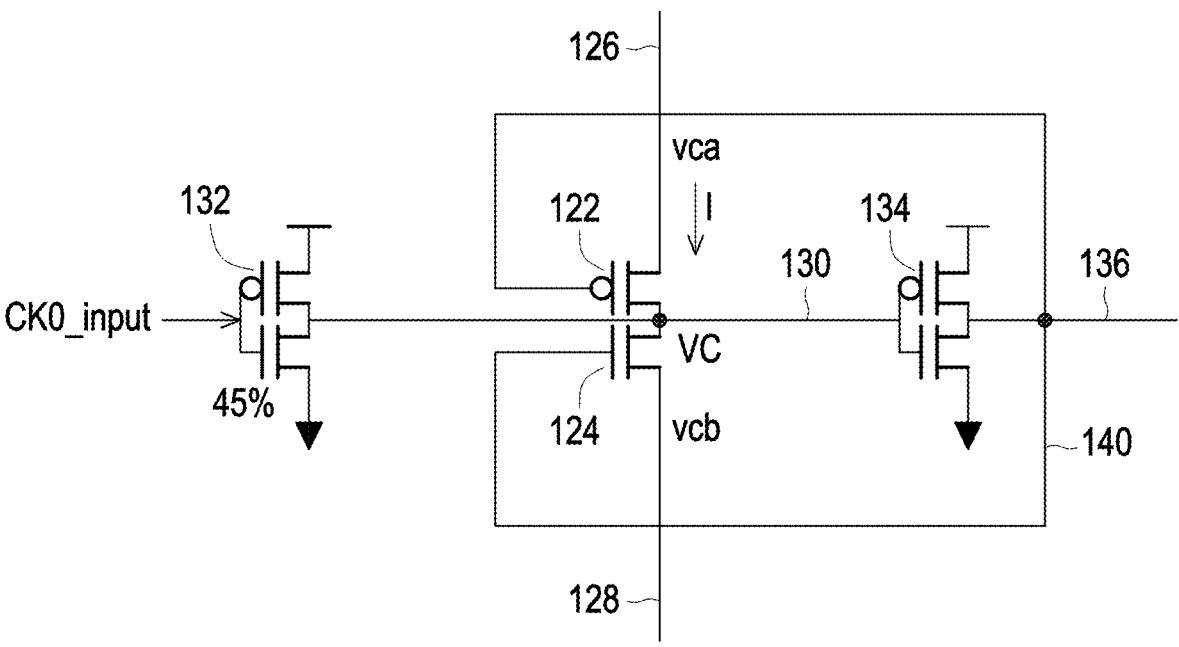
FIG. 3 is an example illustration of duty cycle correction using the DCC circuit of FIG. 1 in accordance with some embodiments.
Figure 4:
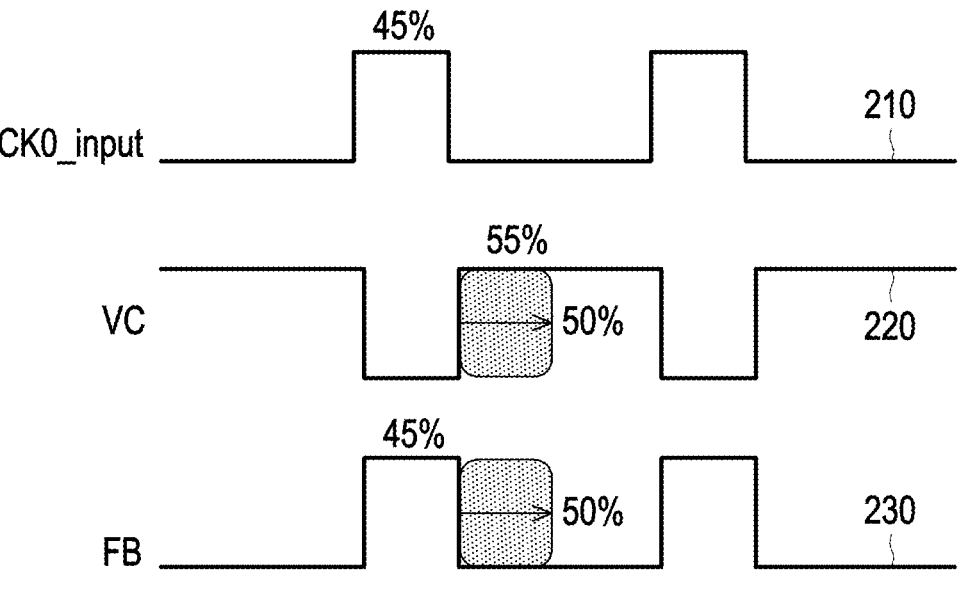
FIG. 4 is example signal diagram of duty cycle correction using the DCC circuit of FIG. 1 in accordance with some embodiments.

In operation, first transistor 122 and second transistor 124 adjust the duty cycle of the input clock to be equal to 50% in conjugation with first trim circuit 104, second trim circuit 106, and feedback circuit 140. FIG. 3 is an example illustration of duty cycle correction using DCC circuit 100 of FIG. 1 and FIG. 4 is example signal diagram of duty cycle correction using DCC circuit 100 of FIG. 1.

As shown in FIG. 3, an example input clock with a duty cycle of 45% is received at invertor 132. That is, and as shown by graph 210 of FIG. 4, the example input clock of FIG. 3 is at a value high for 45% of the clock cycle. Inverter 132 includes a PMOS and NMOS connected together and inverts the input clock and provides inverted output clock at node 130. As shown by graph 220 of FIG. 4, the inverted input clock is at a value high for 55% of the clock cycle. However, a current I is pushed from first trim circuit 104 towards second trim circuit 106 and to a ground node via node 130. The current I, changes or drags the duty cycle of the inverted input clock towards 50% (as shown in graph 220).

Invertor 134 includes a PMOS and NMOS connected together and inverts the inverted clock from node 130 and provides a duty adjusted clock at node 136. As shown in graph 230, the duty adjusted output clock at node 136 is at a value high for 45% of the clock cycle but being changed towards 50%. This duty adjusted output clock of node 136 is provided as feedback to gates of first transistor 122 and second transistor 124. For example, and shown in FIG. 3, node 136 is connected to the gates of first transistor 122 and second transistor 124.

Providing the duty adjusted output clock to the gates of first transistor 122 and second transistor 124 accelerates adjustment of the duty cycle towards 50%. For example, the gate voltage of both first transistor 122 and second transistor 124 vary with trim codes. In addition, depending on a current duty cycle of the duty adjusted output clock, one or both of first transistor 122 and second transistor 124 is switched ON thereby increasing flow of current I towards node 130 thereby accelerating adjustment of the duty cycle towards 50%.

In addition, the current I is determined based on a configuration of each of first trim circuit 104 and second trim circuit 106. A predetermined number of first transistors of first trim circuit 104 are switched on based on a trim code. The trim code is generated based on a current duty cycle of the input clock. For example, if the duty cycle is less than 50% then a trim code is generated to increase the duty cycle. To increase the duty cycle, more first transistors of first trim circuit 104 are switched ON through the generated trim code. On the contrary, if the duty cycle is greater than 50% then a trim code is generated to decrease the duty cycle. To decrease the duty cycle, more second transistors of second trim circuit 106 are switched ON through the generated trim code.

In accordance with example embodiments, first transistors of first trim circuit 104 can be of a different width and length to improve linearity of duty cycle correction. For example, a width of one or more of first transistors can be increased to increase the current I while the length can be increased to decrease the current I. Similarly, second transistors of second trim circuit 106 can be of a different width and length to improve linearity of the duty cycle correction. Varying the length and width of the first transistors of first trim circuit 104 and the second transistors of the second trim circuit 106 improves a linearity of the duty cycle correction.

Returning to FIG. 2, single to differential circuit 108 includes an invertor 142, an invertor 146, an invertor 150, an invertor 154, a pass gate 162, an invertor 166, and an invertor 170. Invertor 146, invertor 150, and invertor 154 form a first branch of single to differential circuit 108. Pass gate 162, invertor 166, and invertor 170 form a second branch of single to differential circuit 108. First branch provides the first output clock (shown as CK_0) and second branch provides the second output clock (shown as CK_180). The second output clock is 180 degrees out of phase from the first output clock.

As shown in FIG. 2, first terminal of invertor 142 is connected to node 136 and a second terminal of inverter 142 is connected to a first terminal of invertor 146 at a node 144. A second terminal of invertor 146 is connected to a first terminal of invertor 150 at node 148. A second terminal of invertor 150 is connected to a first terminal of invertor 154 at node 152. A second terminal of invertor 154 provides the first output clock at node 156.

In the second branch, a first terminal of pass gate 162 is connected to node 144. A second terminal of pass gate 162 is connected to a first terminal of inverter 166 at node 164.

A second termina of invertor 166 is connected to a first terminal of invertor 170 at node 168. A second terminal of invertor 170 provides the second output clock at node 172.

Invertors 142, 146, 150, and 154 propagate the duty adjusted output clock from node 136 towards node 156 via nodes 144, 148, and 152 to generate the first output clock. Pass gate 162 and invertors 142, 166 and 170 propagate the duty adjusted output clock from node 136 towards node 172 via nodes 144, 164, and 168 to generate the second output clock. Nodes 148 and 168 are in phase or are in the same phase as node 136. It will be apparent to person skilled in the art that a different configuration of single to differential circuit can be used to generate the first output clock and the second output clock. In addition, more than two output clocks with varying phase difference can be generated from the duty adjusted output clock.

Figure 5:
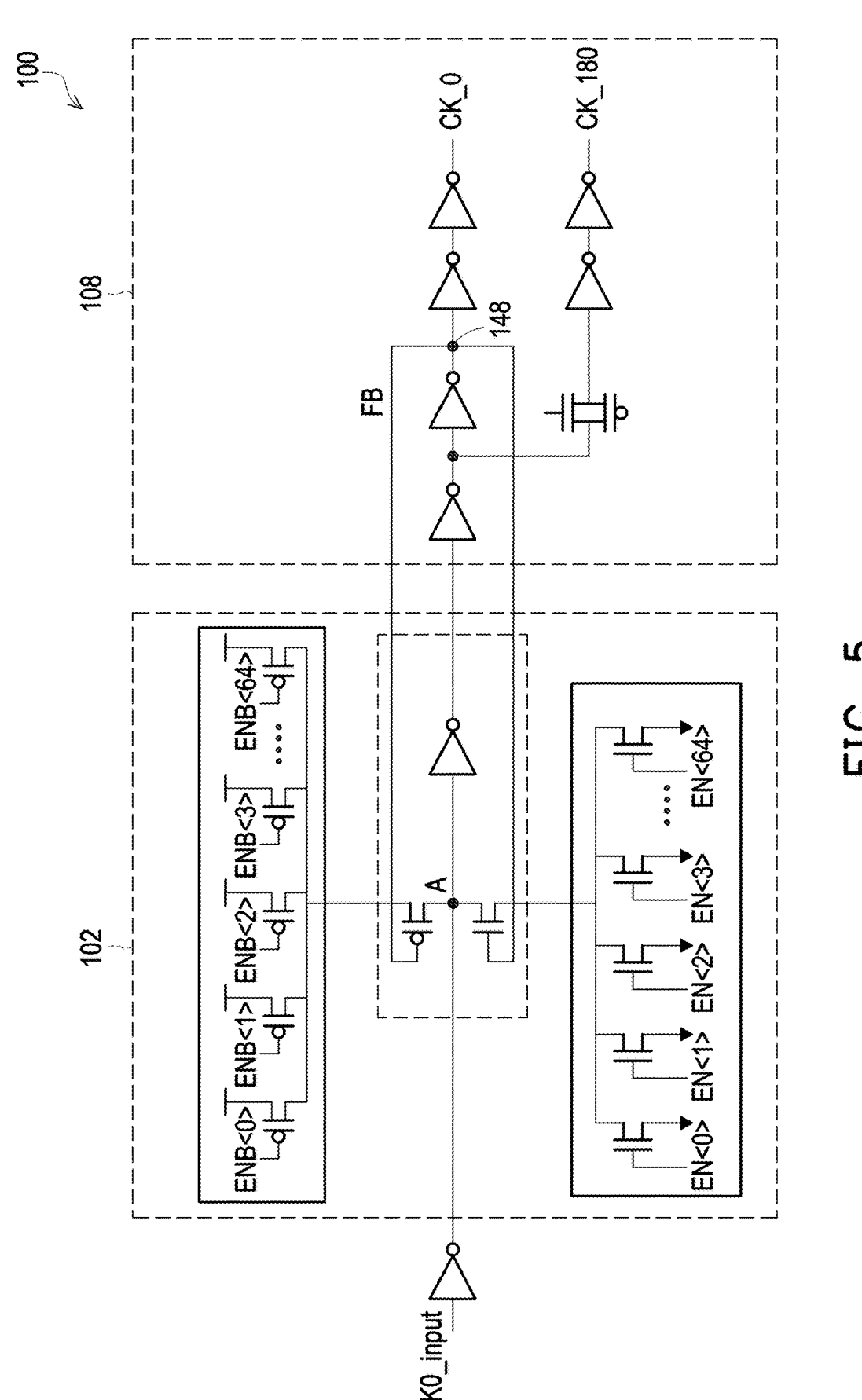
FIG. 5 is another example circuit diagram of the digital DCC circuit of FIG. 1 in accordance with some embodiments.

In accordance with example embodiments, feedback circuit 140 can be connected between any node that in phase with node 136 and gates of first transistor 122 and second transistor 124. FIG. 5 is another circuit diagram of DCC circuit 100 where feedback circuit 140 is connected to node 148 of single to differential circuit 108. As discussed above, node 148 is in the same phase as node 136. DCC circuit 100 of FIG. 5 may have a better linearity than DCC circuit 100 of FIG. 2 by virtue of feedback circuit 140 being connected closer to first output clock compared to that of FIG. 2.

Figure 6:
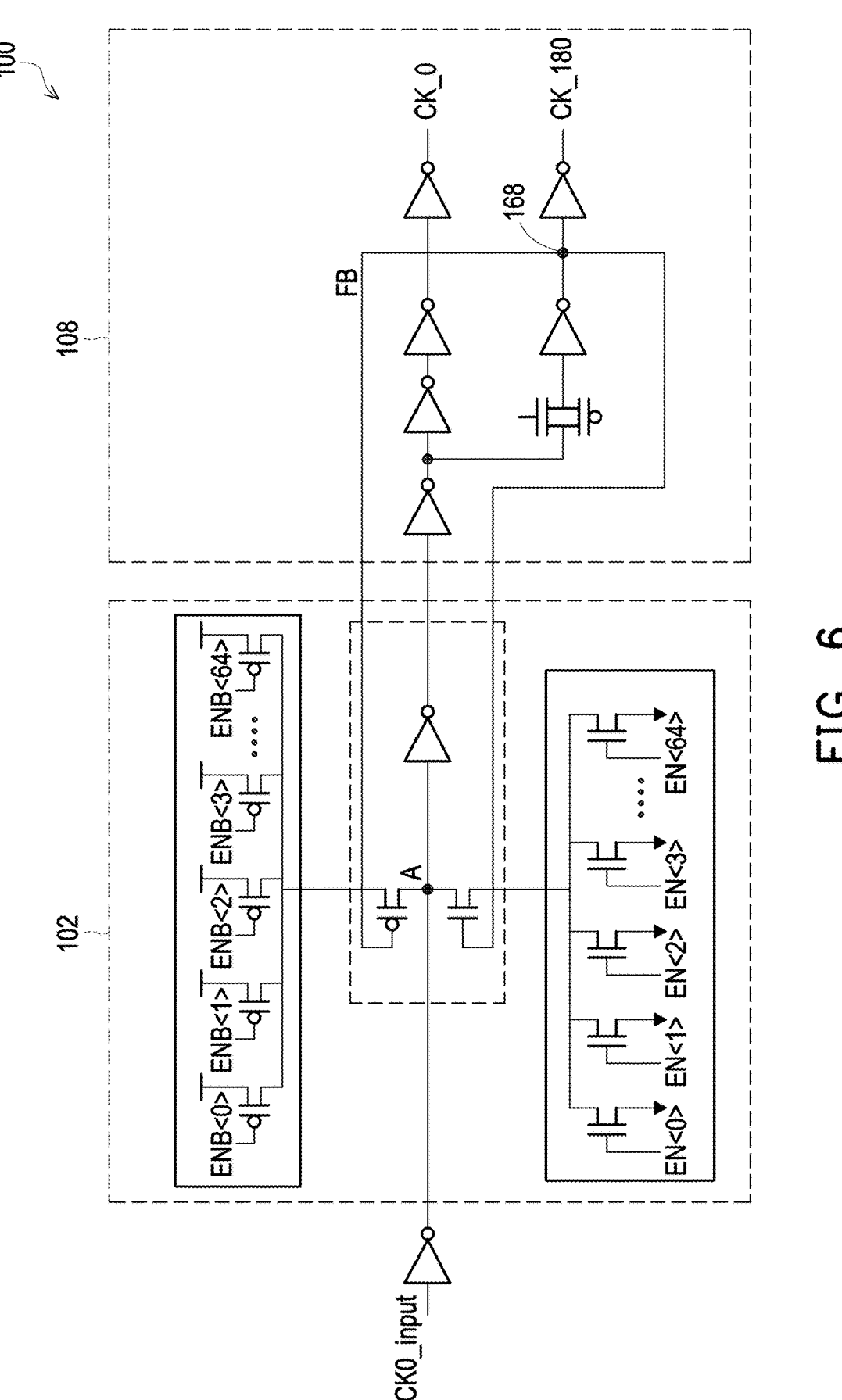
FIG. 6 is an yet another example circuit diagram of the digital DCC circuit of FIG. 1 in accordance with some embodiments.

FIG. 6 is yet another circuit diagram of DCC circuit 100 where feedback circuit 140 is connected to node 168 of single to differential circuit 108. As discussed above, node 168 is in the same phase as node 136. DCC circuit 100 of FIG. 6 may have a better linearity than DCC circuit 100 of FIG. 2 by virtue of feedback circuit 140 being connected closer to second output clock compared to that of FIG. 2.

FIG. 7 is a flow diagram of a method 400 for adjusting a duty cycle of an input clock in accordance with some embodiments. At block 410 of method 400, an input clock is received at a first node (that is, node 130) of control circuit 102. As discussed above, control circuit 102 includes first transistor 122 and second transistor 124 connected at the first node (that is, node 130).

At block 420 of method 400, a duty cycle of the input clock is adjusted based on a first trim code and a second trim code. For example, based on the first trim code, a predetermined number of first transistors of first trim circuit 104 are switched ON. In addition, based on the second trim code, a predetermined number of second transistors of second trim circuit 106 are switched ON. This leads to current I being injected at node 130 thereby changing a duty cycle of the input clock.

At block 430 of method 400, a duty adjusted output clock is provided at second node (that is, node 136) of control circuit 102. At block 440, the duty adjusted output clock is provided as feedback to a gate of each of first transistor 122 and second transistor 124 of control circuit 102. The feedback is provided via feedback circuit 140 and it accelerates adjustment of the duty cycle of the input clock to 50%.

In accordance with example embodiments, a digital duty cycle corrector circuit comprises: a control circuit comprising a first transistor and a second transistor, wherein: a source/drain of the first transistor is connected to a first trim circuit, wherein the first trim circuit provides a first voltage at the source/drain of the first transistor, a drain/source of the first transistor is connected to a drain/source of the second transistor at a first node, a source/drain of the second transistor is connected to a second trim circuit, wherein the second trim circuit provides a second voltage at the source/drain of the second transistor, the control circuit is configured to adjust a duty cycle of an input clock received at the first node and provide a duty adjusted output clock at a second node, and the control circuit further comprises a feedback circuit that connects the second node to a gate of each of the first transistor and the second transistor; and a single to differential circuit connected to the control circuit, wherein the single to differential circuit is configured to generate a first output clock and a second output clock from the duty adjusted output clock.

In example embodiments of the disclosure, a digital duty cycle corrector circuit comprises: a control circuit comprising a first transistor and a second transistor connected at a first node and configured to adjust a duty cycle of an input clock received at the first node and provide a duty adjusted output clock at a second node; a single to differential circuit connected to the control circuit at the second node, wherein the single to differential circuit is configured to generate a first output clock and a second output clock from the duty adjusted output clock; and a feedback circuit configured to provide the duty adjusting output clock to a gate of each of the first transistor and the second transistor.

In accordance with example embodiments, a method of adjusting a duty cycle of an input clock, the method comprising: receiving an input clock at a first node of a control circuit comprising a first transistor and a second transistor connected at the first node; adjusting a duty cycle of the input clock based on a first trim code and a second trim code; providing a duty adjusted output clock at a second node of the control circuit; and providing the duty adjusted output clock as feedback at a gate of each of the first transistor and the second transistor of the control circuit.

This disclosure outlines various embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A digital duty cycle corrector circuit, comprising:
a control circuit comprising a first transistor and a second transistor, wherein:
a source/drain of the first transistor is connected to a first trim circuit, wherein the first trim circuit provides a first voltage at the source/drain of the first transistor, wherein the first trim circuit comprises a first plurality of transistors, and wherein each of the first plurality of transistors are connected in parallel to each other between a supply voltage node and the source/drain of the first transistor,
a drain/source of the first transistor is connected to a drain/source of the second transistor at a first node,
a source/drain of the second transistor is connected to a second trim circuit, wherein the second trim circuit provides a second voltage at the source/drain of the second transistor,
the control circuit is configured to adjust a duty cycle of an input clock received at the first node and provide a duty adjusted output clock at a second node, and the control circuit further comprises a feedback circuit that connects the second node to a gate of each of the first transistor and the second transistor; and a single to differential circuit connected to the control circuit, wherein the single to differential circuit is configured to generate a first output clock and a second output clock from the duty adjusted output clock.

2. The digital duty cycle corrector circuit of claim 1, wherein the second trim circuit comprises a second plurality of transistors, wherein each of the second plurality of transistors are connected in parallel to each other between the source/drain of the second transistor and a ground voltage node.

3. The digital duty cycle corrector circuit of claim 1, wherein the feedback node comprises the second node.

4. The digital duty cycle corrector circuit of claim 1, wherein the feedback node comprises another node in the single to differential circuit that is in a same phase as the second node.

5. The digital duty cycle corrector circuit of claim 1, wherein an inverted clock signal is received at the first node.

6. The digital duty cycle corrector circuit of claim 1, wherein the feedback node comprises another node on a first branch of the single to differential circuit that in a same phase as the second node.

7. The digital duty cycle corrector circuit of claim 1, wherein the feedback node comprises another node on a second branch the single to differential circuit that in a same phase as the second node.

8. The digital duty cycle corrector circuit of claim 1, wherein the control circuit further comprises an invertor connected between the first node and the second node.

9. A digital duty cycle corrector circuit, comprising:

a control circuit comprising a first transistor and a second transistor connected at a first node and configured to adjust a duty cycle of an input clock received at the first node and provide a duty adjusted output clock at a second node;

a single to differential circuit connected to the control circuit at the second node, wherein the single to differential circuit is configured to generate a first output clock and a second output clock from the duty adjusted output clock; and a feedback circuit configured to provide the duty adjusting output clock to a gate of each of the first transistor and the second transistor, wherein the feedback circuit connects another node in the single to differential circuit that in a same phase as the second node to the gate of each of the first transistor and the second transistor.

10. The digital duty cycle corrector circuit of claim 9, wherein the control circuit further comprising:

a first trim circuit connected to a source/drain of the first transistor, wherein the first trim circuit provides a first voltage at the source/drain of the first transistor; and a second trim circuit connected to a source/drain of the second transistor, wherein the second trim circuit provides a second voltage at the source/drain of the second transistor, and wherein a drain/source of the first transistor is connected to a drain/source of the second transistor at the first node.

11. The digital duty cycle corrector circuit of claim 9, wherein the feedback circuit connects the second node to the gate of each of the first transistor and the second transistor.

12. The digital duty cycle corrector circuit of claim 9, wherein the feedback circuit connects the another node on a first branch of the single to differential circuit that is in the same phase as the second node to the gate of each of the first transistor and the second transistor.

13. The digital duty cycle corrector circuit of claim 9, wherein the control circuit further comprises an invertor connected between the first node and the second node.

14. The digital duty cycle corrector circuit of claim 9, wherein the control circuit further comprises an invertor connected between the first node and the second node.

15. The digital duty cycle corrector circuit of claim 9, wherein the first trim circuit comprises a first plurality of transistors, and wherein each of the first plurality of transistors are connected in parallel to each other between a supply voltage node and the source/drain of the first transistor.

16. The digital duty cycle corrector circuit of claim 9, wherein the second trim circuit comprises a second plurality of transistors, wherein each of the second plurality of transistors are connected in parallel to each other between the source/drain of the second transistor and a ground voltage node.

17. A method of adjusting a duty cycle of an input clock, the method comprising:

receiving an input clock at a first node of a control circuit comprising a first transistor and a second transistor connected at the first node;

adjusting a duty cycle of the input clock based on a first trim code and a second trim code;

providing a duty adjusted output clock at a second node of the control circuit; and providing the duty adjusted output clock as feedback at a gate of each of the first transistor and the second transistor of the control circuit, wherein providing the duty adjusted output clock as feedback at the gate of each of the first transistor and the second transistor of the control circuit comprises providing the duty adjusted output clock from another node in a single to differential circuit as feedback at the gate of each of the first transistor and the second transistor of the control circuit.

18. The method of claim 17, further comprising:

generating, by a single to differential circuit connected to the control circuit at the second node, a first output clock and a second output clock from the duty adjusted output clock.

19. The method of claim 17, wherein the first trim circuit comprises a first plurality of transistors, and wherein each of the first plurality of transistors are connected in parallel to each other between a supply voltage node and the source/drain of the first transistor.

20. The method of claim 17, wherein the second trim circuit comprises a second plurality of transistors, wherein each of the second plurality of transistors are connected in parallel to each other between the source/drain of the second transistor and a ground voltage node.

* * * * *